United States Patent [19]

Magome et al.

[11] Patent Number: 4,746,824
[45] Date of Patent: May 24, 1988

[54] HIGH POTENTIAL HOLD CIRCUIT

[75] Inventors: Koichi Magome; Hiroyuki Koinuma; Haruki Toda, all of Yokohama, Japan

[73] Assignee: Kabushiki Kaisha Toshiba, Kawasaki, Japan

[21] Appl. No.: 921,272

[22] Filed: Oct. 21, 1986

[30] Foreign Application Priority Data

Oct. 25, 1985 [JP] Japan .................. 60-239012

[51] Int. Cl.⁴ .............. H03K 5/13; H03K 19/003; G11C 27/02
[52] U.S. Cl. .................. 307/605; 307/353; 307/572
[58] Field of Search .......... 307/200 B, 443, 572–574, 307/353, 605

[56] References Cited

U.S. PATENT DOCUMENTS 4,388,538  6/1983  Ikeda .................. 307/605

OTHER PUBLICATIONS

ISSCC 85/Friday, Feb. 15, 1985, Digest of Technical Papers Session XVIII Fam187 Hot-Carrier Suppressed VLSI with Submicron Geometry pp. 272–273.

Primary Examiner—John Zazworsky
Attorney, Agent, or Firm—Oblon, Fisher, Spivak, McClelland & Maier

[57] ABSTRACT

This invention provides a high potential hold circuit comprising: a high potential node; a high potential hold enhancement mode MOS transistor for holding a potential of the high potential node by setting the high potential hold transistor in an non-conducting state after the node is charged, having one end connected to a first input signal and the other end connected to the high potential node; a discharge enhancement mode MOS transistor for discharging the potential of the high potential node, having one end connected to the ground potential, the other end connected to the high potential node and a gate connected to a second input signal; a field relaxation enhancement mode MOS transistor located between the high potential node and the high potential hold transistor; and charge-discharge means for charging and discharging a potential of a gate of the field relaxation transistor.

16 Claims, 3 Drawing Sheets

HIGH POTENTIAL HOLD CIRCUIT

BACKGROUND OF THE INVENTION

1. Field of the Invention

This invention relates to a high potential hold circuit, the purpose of which is to hold the high potential at the drain (or source) side of MOS transistor. The MOS transistor is set in its non-conducting state by maintaining the gate potential at reference ground potential.

2. Description of the Prior Art

Conventionally, this type of high potential hold circuit is used as a signal delay circuit employed in dynamic RAM circuits. FIG. 1 shows a circuit diagram of a signal delay circuit. MOS transistor Q1, the conduction of which is controlled by input signal φin, and MOS transistor Q2, the conduction of which is controlled by clock signal $\bar{\phi}$, are connected in series between power supply Vdd and ground Vss.

The gate of MOS transistor Q3, one end of which is connected to ground supply Vss, is connected to the junction (node N1) formed between MOS transistors Q1 and Q2. MOS transistor Q4, the conduction of which is controlled by clock signal $\bar{\phi}$, is connected between the other end of MOS transistor Q3 and power supply Vdd. The gate of MOS transistors Q6 and Q7, each of which have one end thereof connected to ground Vss, are respectively connected to the junction (node N2) formed between MOS transistors Q3 and Q4, and one end of MOS transistor Q5, the gate of which is applied to power supply voltage Vdd. The gate of MOS transistor Q8, one end thereof which receives input signal φin, is connected to the other end (node N3) of MOS transistor Q5. MOS transistor Q9, the conduction of which is controlled by clock signal $\bar{\phi'}$, is connected between the other end of MOS transistor Q8 and ground Vss. The gate of MOS transistor Q11, which is connected between the other end of MOS transistor Q7 and power supply Vdd, is connected to the junction (node N4) formed between MOS transistor Q8 and Q9, and the gate of MOS transistor Q10, one end thereof which is connected to power supply Vdd, and the other, to node N5, which is other end of MOS transistor Q6. An enhancement mode MOS capacitor C1 is connected across the gate and drain of MOS transistor Q10, between node N4 and N5. The aforementioned output signal φout, which is delayed, is obtained from the junction formed between MOS transistors Q11 and Q7. The following explanation is an operational description of the circuit configuration described above.

With clock signals $\bar{\phi}$ and $\bar{\phi'}$, in their high ('H') level state, the potentials at N2 and N3 are changed to (vdd Vth) (where Vth represents the threshold voltage of the MOS transistor, which for the purpose of simplifying the explanation can be regarded as being equal for all the MOS transistors). This being the case, nodes, N1, N4 and N5, input signal φin, and output signal φout are at ground potential Vss.

Then, when input signal φin increases from ground, with clock signals $\bar{\phi}$ and $\bar{\phi'}$ in their low ('L') level states, the potential at node N2 becomes equal to (Vdd−Vth), and MOS transistor Q5 ceases to conduct. As a result of the increase in input signal φin, potential V3 of node N3 rises due to the capacitive coupling between the gate and drain of MOS transistor Q8. Consequently, MOS transistor Q8 is able to operate in the triode region, and potential V4 of node N4 becomes equal to input signal φin. When potential V4 exceeds threshold voltage Vth of MOS transistor Q10, MOS transistor Q10 conducts and node N5 starts to charge. At this point, the potential at node N2 drops due to the conduction of MOS transistor Q3. MOS transistor Q6 ceases to conduct, and the charge supplied from power supply Vdd, through MOS transistor Q10, is 'latched in' by node N5.

As a result, the increase in potential V4 at node N4 is accelerated due to the capacitive coupling of MOS capacitor C1. The moment potential V4 exceeds power supply voltage Vdd, potential V3 becomes equal to ground potential Vss, due to the conduction of MOS transistors Q3 and Q5. Since MOS transistor Q8 is in a non-conducting state, the charge accumulated at node N4 is held at high potential, without being able to escape.

At this point, the delayed signal φout of input signal φin, which has suffered no losses due to the threshold voltage Vth, is obtained, as a result of MOS transistor Q11 operating in its triode region.

This condition may be reset by setting input signal φin to its low 'L' level state, and clock signals $\bar{\phi}$ and $\bar{\phi'}$ to their high 'H' level states. However, in order to obtain output signal φout, by correctly delaying the input signal φin, potential V4 at the gate of MOS transistor Q11 is increased beyond (Vdd+Vth), thus making it necessary to maintain this condition. In the aforementioned circuit shown in FIG. 1, the charge at node N4 is supplied via MOS transistor Q8, which is then placed in its non-conducting state, thus holding the potential at node N4. Thus, the gate potentials of MOS transistors Q8 and Q9 are pulled to ground potential Vss, as was usually the case in the past when holding high potentials. In this state, however, the electric field between the gate and drain (or source) being quite strong, with the addition of the electric field between the drain and source, gives rise to surface breakdown. The repeated application of strong electric fields, if only for short periods at a time, results in a loss of circuit reliability due to the very low breakdown voltage as a result of the extremely thin dioxide layer between the gate and drain (or source) of the transistor.

Also, the promotion of miniaturised micro-circuit technology necessitated the introduction of further reductions to drain-source geometries making the device all the more susceptible to punch through. This made the achievement of lower source-drain voltages even more desirable.

The circuit shown in FIG. 2 is proposed as a signal delay circuit capable of eliminating this particular drawback. In this circuit, MOS transistor Q12, the conduction of which is established by power supply voltage Vdd, is inserted between high potential node N4 and MOS transistor Q9. An abbreviated explanation of this circuit is given with reference to FIG. 2, by inclusion of symbols similar to those applied to the same component parts in FIG. 1.

In this configuration, the potential at the junction (node N6) formed between MOS transistors Q9 and Q12 is (Vdd−Vth) (where Vth is the threshold of MOS transistor Q12), even though the potential V4 at node N4 is very high. The potential difference between the gate and drain (or source) of MOS transistor Q9 relaxes from (Vdd+Vth) to (Vdd−Vth), that is, by more than 2 Vth, in the circuit of aforementioned FIG. 2, thus making it possible to improve the device breakdown voltage and circuit reliability.

Also, since the potential difference between the source and drain of MOS transistor Q9 could be reduced, punch through countermeasures were also improved. However, a MOS transistor, capable of being turned on by power supply voltage Vdd, could not be provided between MOS transistor Q8 and node N4, as was the case in aforementioned MOS transistor Q12. Because, by inserting a MOS transistor between MOS transistor Q8 and node N4, the potential at node N4 would drop by about value of threshold voltage Vth. The accompanying delay to the increase in potential at node N4 would then bring about a reduction to the final potential.

Consequently, when input signal $\phi$in, when active, drops to ground potential Vss, MOS transistor Q8 suffers the same unresolvable drawback as MOS transistor Q9, notwithstanding the questionable reliability similar to that of MOS transistor Q9.

SUMMARY OF THE INVENTION

It is an object of this invention is to provide a high potential hold circuit capable of improving, without loss of essential circuit functionality, the MOS transistor gate-drain (or source) breakdown voltage characteristics.

It is a further object of the invention to provide the MOS transistor, capable of maintaining the high potential on the drain (or source), by pulling the gate potential down to the ground potential reference level, thus placing the device in its non-conducting state.

This invention provides a high potential hold circuit comprising: a high potential node; a high potential hold enhancement mode MOS transistor for holding a potential of the high potential node by setting the high potential hold transistor in an non-conducting state after the node is charged, having one end connected to a first input signal and the other end connected to the high potential node; a discharge enhancement mode MOS transistor for discharging the potential of the high potential node, having one end connected to the ground potential, the other end connected to the high potential node and a gate connected to a second input signal; a field relaxation enhancement mode MOS transistor located between the high potential node and the high potential hold transistor; and charge-discharge means for charging and discharging a potential of a gate of the field relaxation transistor.

DETAILED DESCRIPTION OF THE PREFERRED EMBODIMENTS

Figure 1:
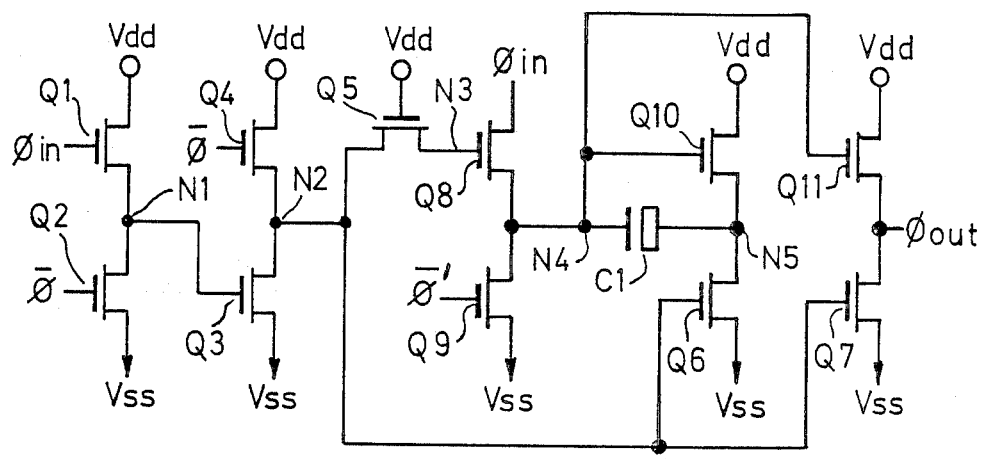
FIGS. 1 and 2 are circuit diagrams which respectively describe conventional high potential hold circuits.
Figure 2:
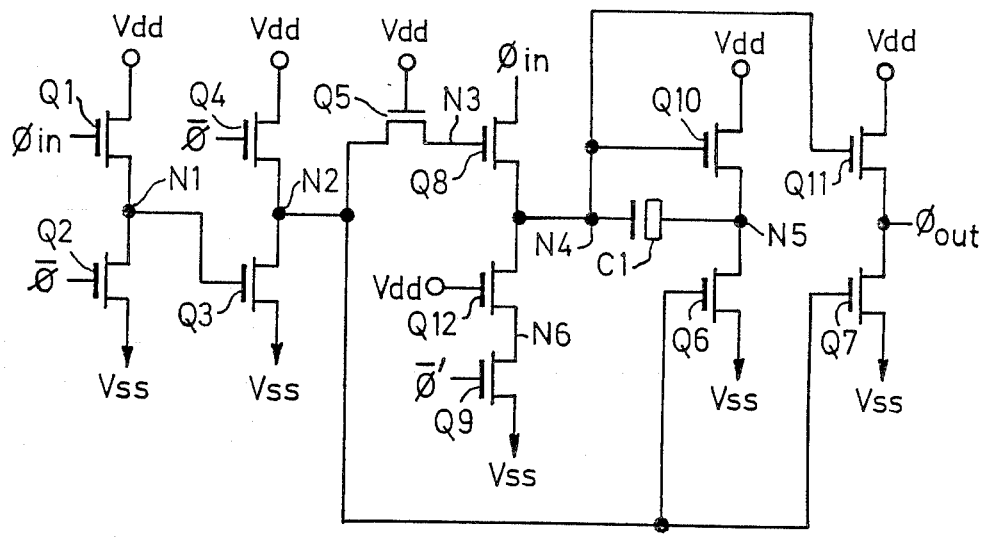
Figure 3:
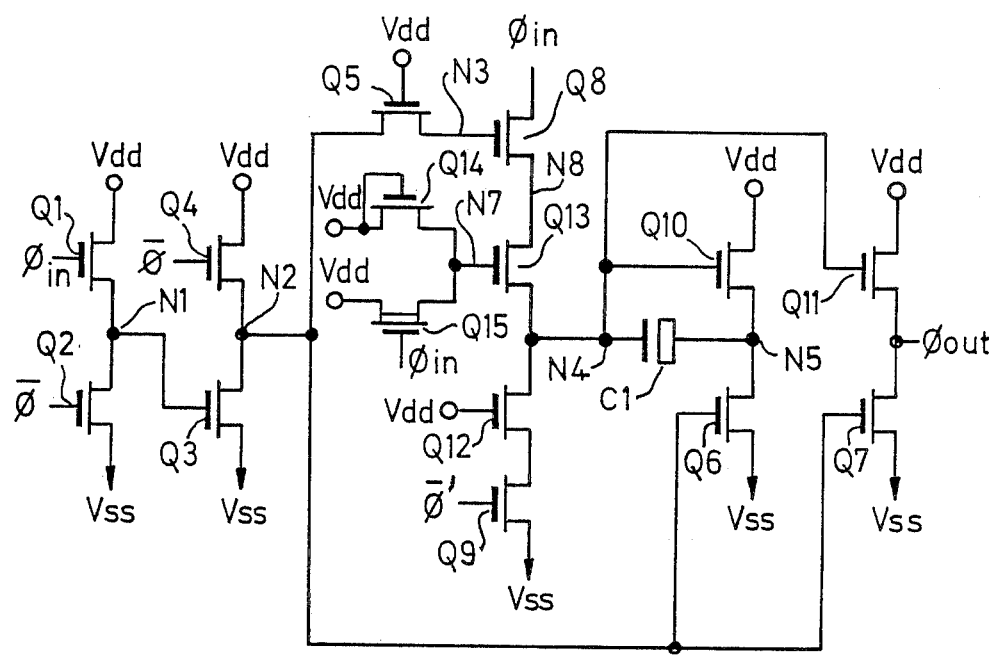
FIG. 3 is a circuit diagram illustrating the high potential hold circuit related to the practical embodiment of this present invention.

The following is an explanation of a practical embodiment of the present invention described by way of example with reference to accompanying figures. Descriptive details, with reference to FIG. 3, are abbreviated, through the inclusion of similar symbols for those components which are the same as in aforementioned FIGS. 1 and 2. That is, field relaxation MOS transistor Q13 is located between MOS transistor Q8 and node N4 in FIG. 2, and MOS transistors Q14 and Q15 are located between the gate of MOS transistor Q13 and power supply Vdd. The gate of MOS transistor Q14 is connected to power supply Vdd, and input signal $\phi$in is applied to the gate of MOS transistor Q15. Each of MOS transistors Q1 to Q14 are of the enhancement mode type, in contrast to MOS transistor Q15, which is a depletion mode device.

The following is an explanation of the principle of operation with regards to the circuit configuration described above. Since the basic principle of operation is similar to that given for FIGS. 1 and 2, only those areas which differ will be explained. When clock signals $\phi$ and $\phi'$ are in their high 'H' level state, and input signal $\phi$in is in a low 'L' level state, the potential at the gate (node N7) of MOS transistor Q13 charges up to (Vdd−Vth), due to the conduction of MOS transistor Q14. And as the level of input signal $\phi$in rises, the charge at node N7 also rises as a result of the capacitive coupling between the junction (node N8) formed by MOS transistors Q8 and Q13, and node N7. At this point, as MOS transistor Q13 operates in its triode region, potential V4 at node N4 rises with the same rate of change as input signal $\phi$in. Consequently, there is neither reduction to the potential at node N4 due to the provision of MOS transistor Q13, nor is the rise in the level delayed. On the one hand, when MOS transistor Q15 is a depletion mode device, with a threshold voltage of Vthd, conduction occurs when input signal $\phi$in becomes $(Vdd+Vthd=Vdd-|Vthd|)$, and potential V7 at node N7 starts to drop towards the power supply potential Vdd.

The moment input signal $\phi$in, that is, potential V8 at node N8 becomes equal to power supply potential Vdd, potential V7 becomes equal to the level at power supply Vdd, and since MOS transistor Q13 ceases to conduct, the high potential charged at node N4 can be maintained. At this point, however, potential V3 at node N3 becomes equal to ground reference potential Vss, and since potential V8 at node N8 only rises to about the level of power supply Vdd, the potential difference between the gate and source of MOS transistor Q8 can be reduced, compared to a situation in which MOS transistor Q13 and Q15 have beem omitted, thus improving circuit reliability.

The following is a summary of the action of MOS transistors Q13 to Q15. The action of MOS transistor Q14 is to charge node N7 and 'latch-in' the electric charge. On the other hand, MOS transistor Q15 pulls the charge at node N7, which has increased due to the capacitive coupling, up to power supply voltage Vdd, so that when node N4 rises above the power supply potential Vdd, the charge will not leak from node N4 to N8. Also, MOS transistor Q13 operates to prevent potential V8 at node N8 increasing higher than power supply potential Vdd.

According to this configuration, drops in potential during the charging of node N4 and delays to the rise in potential are prevented due to the provision of field relaxation MOS transistor Q13. This enables the breakdown voltage to be improved, by reducing the potential difference between the gate and source of MOS transistor Q8, making it possible to increase circuit reliability.

Figure 4:
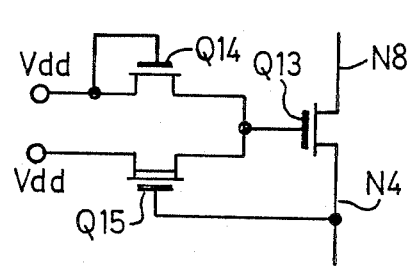
FIGS. 4 to 8 are circuit diagrams which respectively describe alternative embodiments to the present invention.
Figure 5:
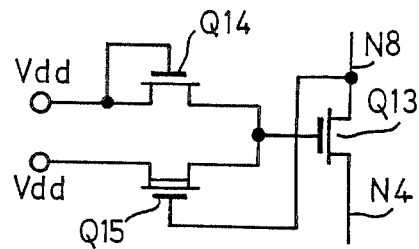

The aforementioned practical embodiment is devised so that input signal φin is applied to the gate of MOS transistor Q15. However, since the timing of the rising signal should be the same as that of input signal φin, similar effects under similar operational conditions can be obtained, whether the gate of MOS transistor Q15 is connected to node N4 or to node N8 as shown in FIGS. 4 and 5.

Figure 6:
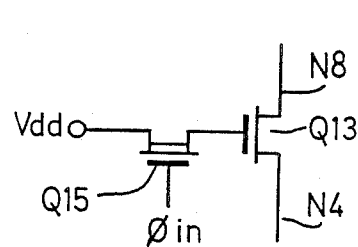
Figure 7:
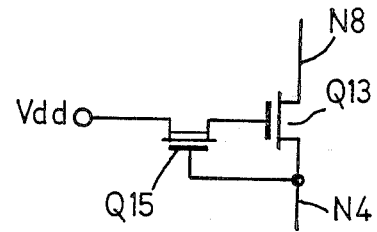
Figure 8:
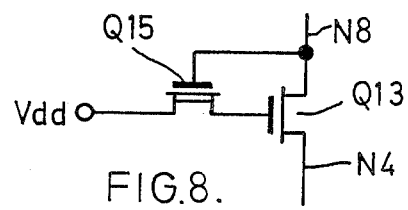

Also, with the threshold voltage of MOS transistor Q14 of Vthe, and a threshold voltage of MOS transistor Q15 of Vthd, MOS transistor Q15 may be omitted since node N7 is charged to ($Vss - Vthd = Vss + |Vthd| = Vdd - Vthe$) even at the precharge period when the input signal φin is in a low 'L' level state, provided the threshold voltage of MOS transistor Q15 is set to Vthd, so as to satisfy the relationship ($|Vthd| = Vdd - Vthe$). The circuit configurations satisfying these conditions are shown in FIGS. 6, 7 and 8.

Figure 9:
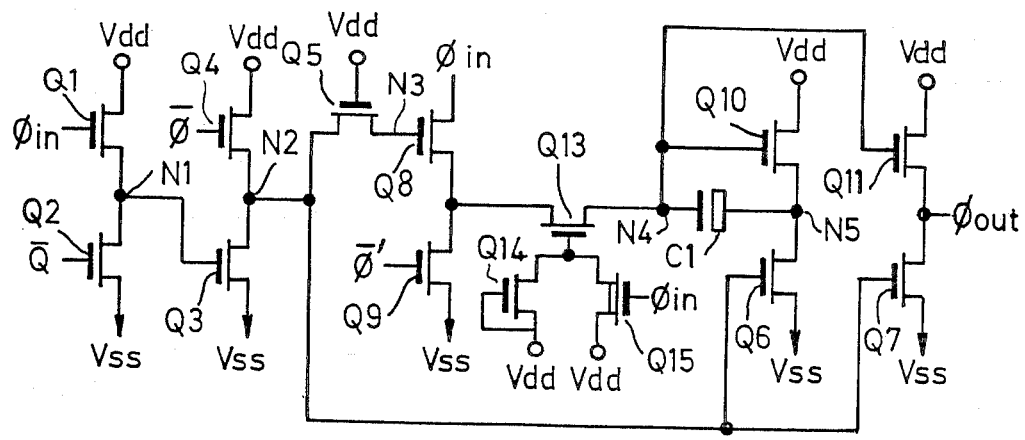
FIG. 9 is a circuit diagram which shows an additional configuration when providing a high potential generator circuit by means of this invention in the signal delay circuit.

FIG. 9 shows an additional configuration for the signal delay circuit. That is, field relaxation MOS transistor Q13 is provided between the junction (node N4) formed by MOS transistor Q8 and Q9, and one end of MOS capacitor C1. In this configuration, since MOS transistor Q13 substitutes for the function of MOS transistor Q12 in FIG. 3, MOS transistor Q12 is omitted. Furthermore, the operation is similar to that of the circuit in FIG. 3, thus giving rise to similar effects.

According to the present invention described above, a high potential hold circuit is achieved, which is capable of improving the MOS transistor gate-drain (or source) breakdown voltage characteristics, without the loss of essential circuit functionality. The purpose of the MOS transistor, in addition to charging the high potential node, maintains the high potential on the drain (or source), by pulling the gate potential down to ground potential reference level, thus placing the MOS transistor in its non-conducting state.

What is claimed is:

1. A high potential hold circuit comprising:
   a high potential node;
   a high potential hold enhancement mode MOS transistor for holding a potential of the high potential node by setting the high potential hold transistor in a non-conducting state after the node is charged, having one terminal connected to a first input signal and a second terminal connected to the high potential node;
   an enhancement mode MOS transistor for discharging the potential of the high potential node, having one terminal connected to the ground potential, a second terminal connected to the high potential node and a gate connected to a second input signal;
   a field relaxation enhancement mode MOS transistor located between a high potential node and a high potential hold transistor; and
   means for charging and discharging a potential of a gate of the field relaxation transistor having a depletion mode MOS transistor located between the gate of the field relaxation enhancement mode MOS transistor and a power supply.

2. A high potential hold circuit according to claim 1 wherein the field relaxation transistor is located between the enhancement mode MOS transistor for discharging and the high potential hold transistor.

3. A high potential hold circuit according to claim 2 wherein the depletion mode MOS transistor has a gate connected to the first input signal.

4. A high potential hold circuit according to claim 2 wherein the depletion mode MOS transistor has a gate connected to the high potential node.

5. A high potential hold circuit according to claim 2 wherein the depletion mode MOS transistor has a gate connected to a second terminal of the high potential hold transistor.

6. A high potential hold circuit according to claim 3 wherein the means for charging and discharging also includes a first enhancement mode MOS transistor located between the gate of the field relaxation transistor and the power supply, having a gate connected to the power supply.

7. A high potential hold circuit according to claim 4 wherein the means for charging and discharging also includes a first enhancement mode MOS transistor located between the gate of the field relaxation transistor and the power supply, having a gate connected to the power supply.

8. A high potential hold circuit according to claim 5 wherein the means for charging and discharging also includes a first enhancement mode MOS transistor located between the gate of the field relaxation transistor and the power supply, having a gate connected to the power supply.

9. A high potential hold circuit according to claim 1 wherein the field relaxation transistor is located between the high potential node and a junction node of the high potential hold transistor and the discharge transistor.

10. A high potential hold circuit according to claim 9 wherein the depletion mode MOS transistor has a gate connected to the first input signal.

11. A high potential hold circuit according to claim 9 wherein the depletion mode MOS transistor has a gate connected to the high potential node.

12. A high potential hold circuit according to claim 9 wherein the depletion mode MOS transistor has a gate connected to a second terminal of the high potential hold transistor.

13. A high potential hold circuit according to claim 10 wherein the means for charging and discharging also includes a first enhancement mode MOS transistor located between the gate of the field relaxation transistor and the power supply, having a gate connected to the power supply.

14. A high potential hold circuit according to claim 11 wherein the means for charging and discharging also includes a first enhancement mode MOS transistor located between the gate of the field relaxation transistor and the power supply, having a gate connected to the power supply.

15. A high potential hold circuit according to claim 12 wherein the means for charging and discharging also includes a first enhancement mode MOS transistor located between the gate of the field relaxation transistor and the power supply, having a gate connected to the power supply.

16. A high potential hold circuit comprising:
    a high potential node;
    a high potential hold enhancement mode MOS transistor for holding a potential of the high potential node by setting the high potential hold transistor in a non-conducting state after the node is charged, having one terminal connected to a first input signal and a second terminal connected to the high potential node;

an enhancement mode MOS transistor for discharging the potential of the high potential node, having one terminal connected to the ground potential, a second terminal connected to the high potential node and a gate connected to a second input signal;

a field relaxation enhancement mode MOS transistor located between a high potential node and a high potential hold transistor;

means for charging and discharging a potential of a gate of the field relaxation transistor; and a second enhancement mode MOS transistor located between the high potential node and the discharge transistor, having a gate connected to a power supply.

* * * * *